United States Patent
Hart et al.

(10) Patent No.: US 8,584,612 B2
(45) Date of Patent: Nov. 19, 2013

(54) UV LAMP ASSEMBLY OF DEGAS CHAMBER HAVING ROTARY SHUTTERS

(75) Inventors: William T. Hart, Castro Valley, CA (US); Fred Dennis Egley, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 701 days.

(21) Appl. No.: 12/640,910

(22) Filed: Dec. 17, 2009

(65) Prior Publication Data
US 2011/0146705 A1 Jun. 23, 2011

(51) Int. Cl.
| | |
|---|---|
| C23C 16/00 | (2006.01) |
| A45D 20/40 | (2006.01) |
| F24C 7/00 | (2006.01) |
| F26B 3/30 | (2006.01) |
| A21B 2/00 | (2006.01) |

(52) U.S. Cl.
USPC .......... 118/50.1; 392/407; 392/411; 392/416; 392/415

(58) Field of Classification Search
USPC .................. 118/50.1; 392/407, 411, 416, 415
See application file for complete search history.

(56) References Cited

U.S. PATENT DOCUMENTS

| | | | |
|---|---|---|---|
| 2,497,676 A * | 2/1950 | Lashells ........................ 392/411 |
| 2,560,808 A * | 7/1951 | MacCallum .................... 34/562 |
| 3,733,709 A | 5/1973 | Bassemir et al. |
| 3,819,929 A | 6/1974 | Newman |
| 3,836,751 A * | 9/1974 | Anderson ...................... 219/411 |
| 3,894,343 A | 7/1975 | Pray et al. |
| 3,967,385 A | 7/1976 | Culbertson |
| 4,005,135 A * | 1/1977 | Helding ..................... 422/186.3 |
| 4,005,138 A | 1/1977 | Plattner et al. |
| 4,010,374 A * | 3/1977 | Ramler ....................... 250/492.1 |
| 4,015,340 A | 4/1977 | Treleven |
| 4,025,795 A | 5/1977 | Lackore et al. |
| 4,049,987 A | 9/1977 | Helms |
| 4,319,125 A * | 3/1982 | Prince .......................... 126/92 B |
| 5,262,902 A | 11/1993 | Okumura et al. |
| 5,470,799 A | 11/1995 | Itoh et al. |
| 5,534,107 A | 7/1996 | Gray et al. |
| 5,572,091 A | 11/1996 | Langer et al. |
| 5,716,495 A | 2/1998 | Butterbaugh et al. |
| 5,781,693 A | 7/1998 | Ballance et al. |
| 5,788,940 A | 8/1998 | Cicha et al. |

(Continued)

FOREIGN PATENT DOCUMENTS

| | | |
|---|---|---|
| JP | 2002-016033 A | 1/2002 |
| KR | 10-0363846 B1 | 11/2002 |

OTHER PUBLICATIONS

Commonly Assigned U.S. Appl. No. 12/607,659, filed Oct. 28, 2009.

(Continued)

*Primary Examiner* — Keath Chen
(74) *Attorney, Agent, or Firm* — Buchanan Ingersoll & Rooney PC

(57) ABSTRACT

A UV lamp assembly having rotary shutters. Each rotary shutter has a concave wall with a reflective concave surface. The rotary shutters can be collectively rotated between an open position and an closed position. At the open position, the rotary shutters do not block UV light of UV lamps from leaving the UV lamp assembly while at the closed position the rotary shutters block UV light from leaving the UV lamp assembly.

14 Claims, 9 Drawing Sheets

(56) References Cited

U.S. PATENT DOCUMENTS

| | | | |
|---|---|---|---|
| 5,861,633 A | 1/1999 | Mandellos | |
| 5,922,219 A | 7/1999 | Fayfield et al. | |
| 5,983,827 A * | 11/1999 | Cookingham et al. | 116/288 |
| 6,012,304 A | 1/2000 | Loxley et al. | |
| 6,015,503 A | 1/2000 | Butterbaugh et al. | |
| 6,015,759 A | 1/2000 | Khan et al. | |
| 6,065,481 A | 5/2000 | Fayfield et al. | |
| 6,108,126 A | 8/2000 | Hagiwara et al. | |
| 6,156,079 A | 12/2000 | Ho et al. | |
| 6,187,133 B1 | 2/2001 | Knoot | |
| 6,191,428 B1 | 2/2001 | Gilberti | |
| 6,280,801 B1 | 8/2001 | Schmitt | |
| 6,355,587 B1 | 3/2002 | Loxley et al. | |
| 6,393,211 B1 * | 5/2002 | Jolan et al. | 392/423 |
| 6,465,374 B1 | 10/2002 | Butterbaugh et al. | |
| 6,465,799 B1 | 10/2002 | Kimble et al. | |
| 6,649,921 B1 | 11/2003 | Cekic et al. | |
| 6,720,566 B2 | 4/2004 | Blandford | |
| 6,797,966 B2 | 9/2004 | Summers et al. | |
| 6,832,844 B2 | 12/2004 | Guzorek | |
| 6,843,202 B2 | 1/2005 | Kusuda | |
| 7,036,957 B2 | 5/2006 | Paravantsos | |
| 7,045,746 B2 * | 5/2006 | Devine et al. | 219/411 |
| 7,081,290 B2 | 7/2006 | Takahashi et al. | |
| 7,365,037 B2 | 4/2008 | Sato et al. | |
| 7,566,891 B2 | 7/2009 | Rocha-Alvarez et al. | |
| 7,589,336 B2 | 9/2009 | Kaszuba et al. | |
| 2001/0012604 A1 | 8/2001 | Okase et al. | |
| 2001/0034004 A1 | 10/2001 | Kitamura | |
| 2004/0203251 A1 | 10/2004 | Kawaguchi et al. | |
| 2005/0268467 A1 | 12/2005 | Woods-Hunter | |
| 2006/0196525 A1 | 9/2006 | Vrtis et al. | |
| 2007/0228618 A1 | 10/2007 | Kaszuba et al. | |
| 2007/0252500 A1 * | 11/2007 | Ranish et al. | 313/25 |
| 2007/0286963 A1 | 12/2007 | Rocha-Alvarez et al. | |
| 2008/0067425 A1 | 3/2008 | Kaszuba et al. | |
| 2008/0143806 A1 | 6/2008 | Claeys | |
| 2009/0045714 A1 | 2/2009 | Claeys | |
| 2009/0065027 A1 | 3/2009 | Kawamura et al. | |
| 2011/0097900 A1 | 4/2011 | Augustino et al. | |
| 2011/0306213 A1 | 12/2011 | Wang et al. | |

OTHER PUBLICATIONS

Carriere, L. A. et al., "Economics of Switching Fluorescent Lamps", IEEE Transactions on Industry Applications, vol. 24, No. 3, pp. 370-379, May/Jun. 1988 (IRC Paper No. 1562).

International Search Report and Written Opinion dated Aug. 24, 2011 for PCT/US2010/003090.

* cited by examiner

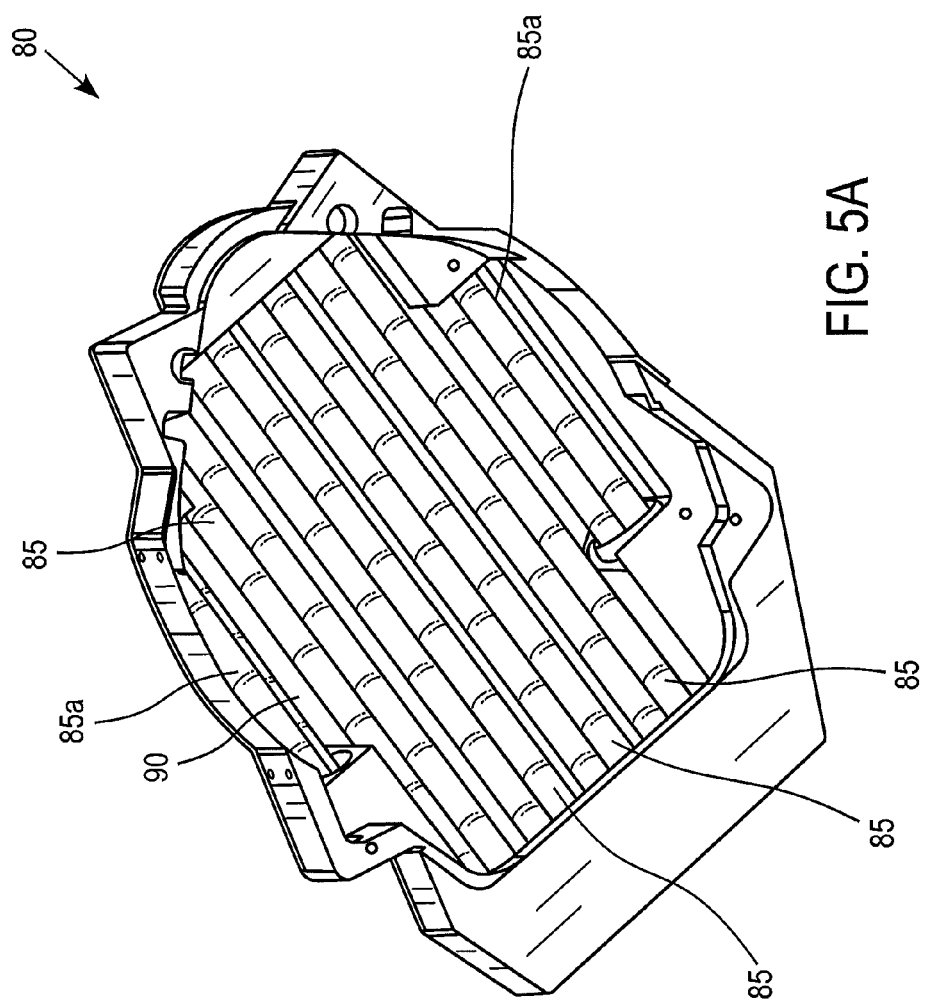

UV LAMP ASSEMBLY OF DEGAS CHAMBER HAVING ROTARY SHUTTERS

BACKGROUND

During plasma processing of semiconductor substrates wherein the semiconductor substrates are exposed to halogen-containing process gases, a residue of the process gases can remain on surfaces of the semiconductor substrates. Such residue can cause defects in the semiconductor substrates in downstream processing steps, and can contaminate other semiconductor substrates in the processing pipeline. Therefore, it is desirable to remove such residue from the semiconductor substrates in a degas chamber.

SUMMARY

A UV lamp assembly of a degas chamber comprising a plurality of parallel UV lamps and rotary shutters, each rotary shutter comprising a concave wall surrounding a UV lamp and two flanges extending outwardly from longitudinal edges of the concave wall, the rotary shutters configured to rotate between an open position and a closed position, wherein the rotary shutters at the open position are arranged above the UV lamps so as to not block UV light of the UV lamps from passing into the degas chamber; and the rotary shutters at the closed position, at which the flanges of adjacent rotary shutters overlap to prevent UV light leakage, are arranged below the UV lamps so as to block UV light of the UV lamps from passing into the degas chamber.

BRIEF DESCRIPTION OF FIGURES

FIG. 2b shows an enlarged top view of an end portion of the rotary shutter in FIG. 2a.

FIG. 5a shows a perspective view of a UV lamp assembly wherein the rotary shutters are in the open position.

DETAILED DESCRIPTION

Figure 1:
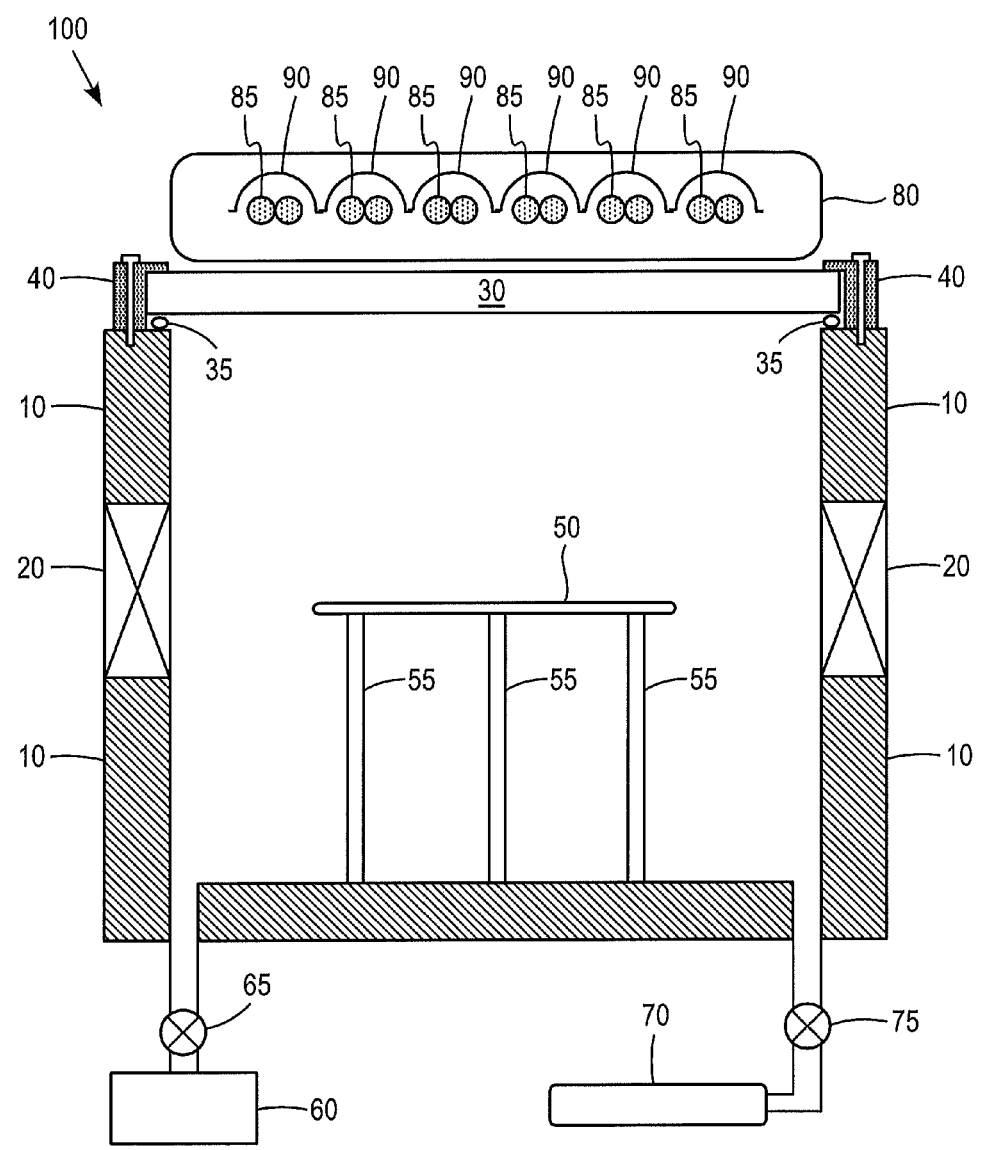
FIG. 1 shows a schematic cross section of a degas chamber comprising a UV lamp assembly.

FIG. 1 shows a schematic cross section of an exemplary degas chamber 100. The degas chamber 100 comprises a chamber wall 10, made of a metallic material such as aluminum. A quartz window 30 is clamped to a top of the chamber wall 10 by a plurality of clamps 40. The quartz window 30 is preferably made of synthetic quartz for its high transmission of UV light. Synthetic quartz is typically untwined and produced in an autoclave via the hydrothermal process. A continuous O-ring 35 between the quartz window 30 and the chamber wall 10 provides a vacuum seal. A UV lamp assembly 80 is disposed above the quartz window 30, preferably with a gap therebetween. A vacuum pump 60 is connected to the degas chamber 100 through an exhaust port which can be closed by a valve 65. A gas source 70 is connected to the degas chamber 100 through a gas line which can be closed by another valve 75.

The quartz window 30 is configured to be mounted on the top of the degas chamber 100 in which UV light from the UV lamp assembly 80 is transmitted through the quartz window 30 while a gas such as ozone or oxygen is flowed in the degas chamber 100 to remove halogen-containing residues such as etch byproducts from a semiconductor substrate 50 such as a 300 mm wafer supported in the degas chamber 100. Details of the quartz window 30 are disclosed in a commonly assigned U.S. patent application Ser. No. 12/607,659, which is hereby incorporated by reference. However, the UV lamp assembly 80 can be used with degas chamber systems other than that shown in FIG. 1.

Referring to FIG. 1, during processing in the degas chamber 100, the semiconductor substrate 50 is transferred through a loading door 20 in the chamber wall 10 and placed on a plurality of substrate support pins 55. The degas chamber 100 is evacuated by the vacuum pump 60 and ozone gas or $O_2$ gas from the gas source 70 flows into the degas chamber 100. Gas pressure in the degas chamber 100 is preferably maintained from 10 mTorr to 10 Torr. The UV lamp assembly 80 irradiates the semiconductor substrate 50 through the quartz window 30 with UV light preferably of a wavelength of 254 nm and intensity between 0.05 and 5 W/cm$^2$, for a period of 10 seconds to 1 minute. Ozone gas or $O_2$ gas absorbs UV light and decomposes into O radicals (atomic oxygen) which react with halogen-containing residue on the semiconductor substrate 50. The reaction products are gaseous and are evacuated from the degas chamber 100 by the vacuum pump 60.

During a process of transporting the semiconductor substrate 50 into and out from the degas chamber 100, it is desirable to prevent UV light of the UV lamp assembly 80 from escaping the degas chamber 100, in order to protect human operators and equipment nearby. However, to minimize delay in processing substrates and to prevent premature failure of UV lamps 85, it is desirable that UV lamps 85 in the UV lamp assembly 80 remain powered rather than being switched on and off during each substrate transport.

The UV lamp assembly 80 includes rotary shutters 90 which can be rotated to a closed position to block UV light from the UV lamps 85 when UV light is not needed in the degas chamber 100, such as during the process of transporting the substrate 50 into and out from the degas chamber 100. When UV light from the UV lamps 85 is needed for a degas process, the rotary shutters 90 in the UV lamp assembly 80 can be rotated to an open position and allow UV light to reach the substrate 50 in the degas chamber 100.

Figure 2A:
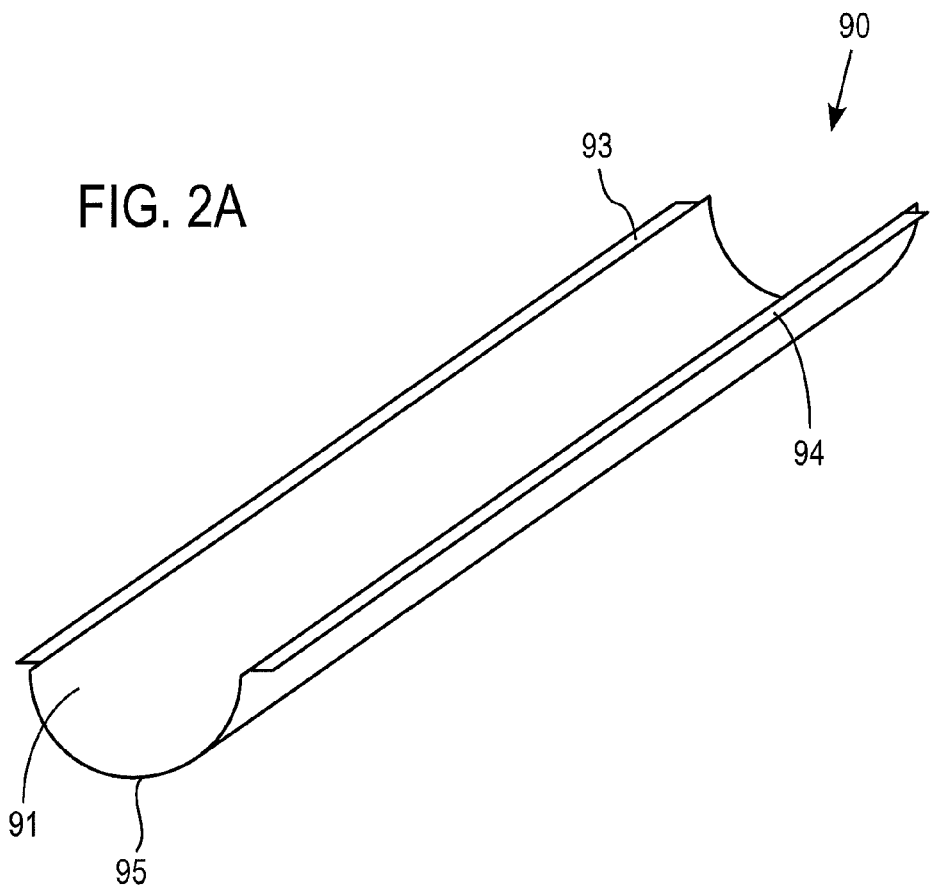
FIG. 2a shows a perspective view of a rotary shutter.

FIG. 2a shows a perspective view of a rotary shutter 90 according to an embodiment. The rotary shutter 90 comprises a concave (e.g. semi-cylindrical, semi-prismatic) wall 95 and two preferably co-planar flanges 93 and 94 extending outwardly along longitudinal edges of the concave wall 95. The flanges 93 and 94 preferably have a width of about 0.07 to 0.09 inch. The rotary shutter 90 is made of a material opaque to UV light, such as aluminum. A concave surface 91 of the concave wall 95 is preferably a reflective surface (such as a polished bare aluminum surface). Interior surfaces of the degas chamber 100 exposed to UV light of the UV lamp assembly 80 are preferably blackened (e.g. by anodization on aluminum surfaces) to reduce undesirable reflection of UV light.

Figure 2B:
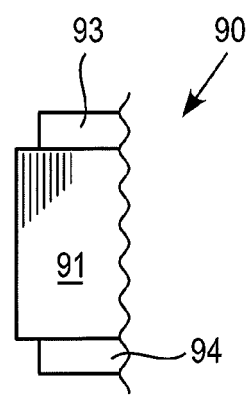

Preferably, the flanges 93 and 94 stop short of the ends of the concave wall 95 to provide a gap in the longitudinal direction by at least about 0.1 inch from each end edge of the concave wall 95 which allows the concave wall 95 to be received in a groove of a support member. FIG. 2*b* shows an enlarged top view of an end portion the rotary shutter 90.

Figure 3:
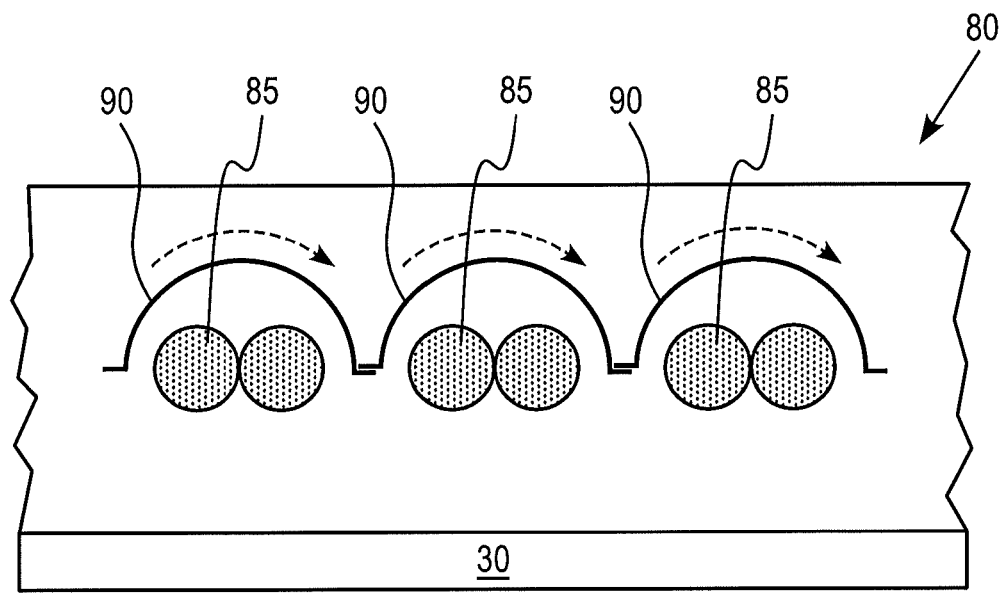
FIG. 3 shows a schematic cross section of the UV lamp assembly of FIG. 1, wherein the rotary shutters are in an open position.

FIG. 3 shows a cross sectional schematic of the UV lamp assembly 80, wherein rotary shutters 90 are in an open position, according to an embodiment. The UV lamp assembly 80 comprises a plurality of UV lamps 85 disposed parallel to each other. The UV lamps 85 can be arranged parallel with each other and preferably cover substantially the entire area of the quartz window 30 to achieve uniform UV light intensity above a substrate in the chamber. The UV lamps 85 can have identical or different lengths sized to overlay the quartz window 30. A single rotary shutter 90 surrounds each UV lamp 85. Each UV lamp 85 can have a tubular shape, a dual-tubular shape or other suitable shape. In the open position, the rotary shutters 90 are arranged above the UV lamps 85 and UV light from the UV lamps 85 can pass directly through the quartz window 30 into the degas chamber 100. The concave surface 91 of each rotary shutter 90 reflects UV light downward to enhance intensity and uniformity of the UV light. The rotary shutters 90 are maintained in the open position during a degas process.

Figure 4:
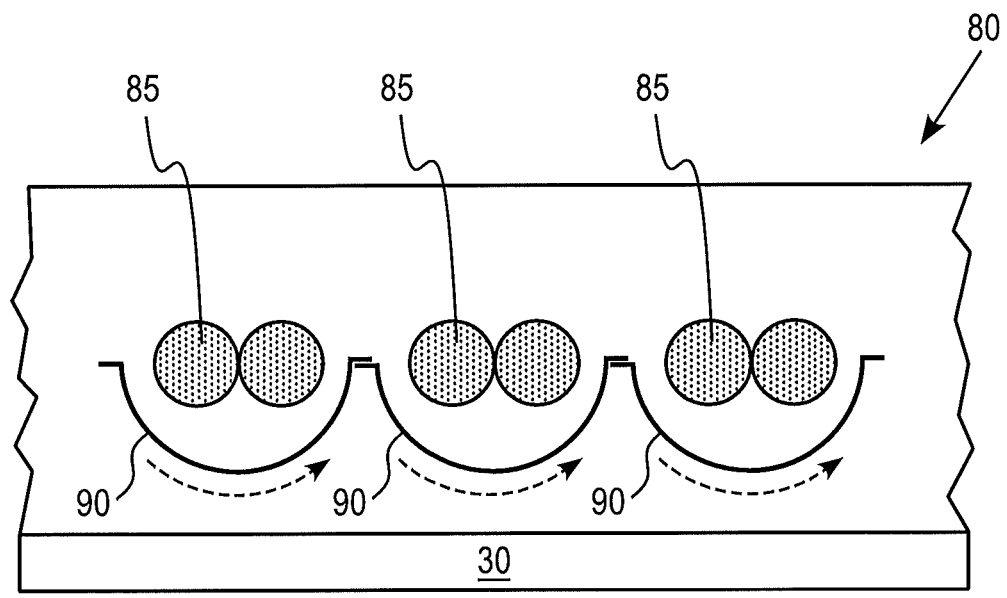
FIG. 4 shows a schematic cross section of the UV lamp assembly of FIG. 1, wherein the rotary shutters are in an closed position.

FIG. 4 shows a cross sectional schematic of the UV lamp assembly 80, wherein rotary shutters 90 are in a closed position, according to an embodiment. In the closed position, the rotary shutters 90 are arranged below the UV lamps 85 and block a substantial portion (preferably more than 99%) of UV light from the UV lamps 85 from passing through he window 30. In the closed position, a lower side of a flange 93 of one rotary shutter 90 overlaps an upper side of a flange 94 of an adjacent rotary shutter preferably by about 0.03 to 0.05 inch, more preferably by about 0.04 inch to minimize UV light leakage.

The rotary shutters 90 can be rotated from the open position to the closed position by simultaneously rotating all the rotary shutters 90 around the UV lamps 85 by about 180°. The rotary shutters 90 can be rotated from the closed position to the open position by simultaneously rotating all the rotary shutters 90 in the opposite direction by about 180°.

The rotary shutters 90 can be driven between the open and closed positions by any suitable mechanism. The UV lamps 85 are preferably held stationary and do not rotate when the rotary shutters 90 move from the closed position to the open position. For dual-tubular shaped UV lamps 85, the outermost UV lamps 85*a* can be angled such that one of the dual tubes is located closer to the quartz window 30 and the other one of the dual tubes is located farther from the quartz window 30.

FIG. 5*a* shows a perspective view of an exemplary UV lamp assembly 80 comprising six UV lamps 85 positioned parallel to each other. The rotary shutters 90 are in the open position. The UV lamps 85 can be any tubular UV lamps, such as White-Rodgers UVP-06207 Germicidal UV Lamps. Two outermost UV lamps 85*a* can be shorter in length to accommodate the particular shape of the quartz window 30 (not shown). For example, the outermost lamps can extend 30 to 90% of the length of the other four lamps therebetween.

Figure 5B:
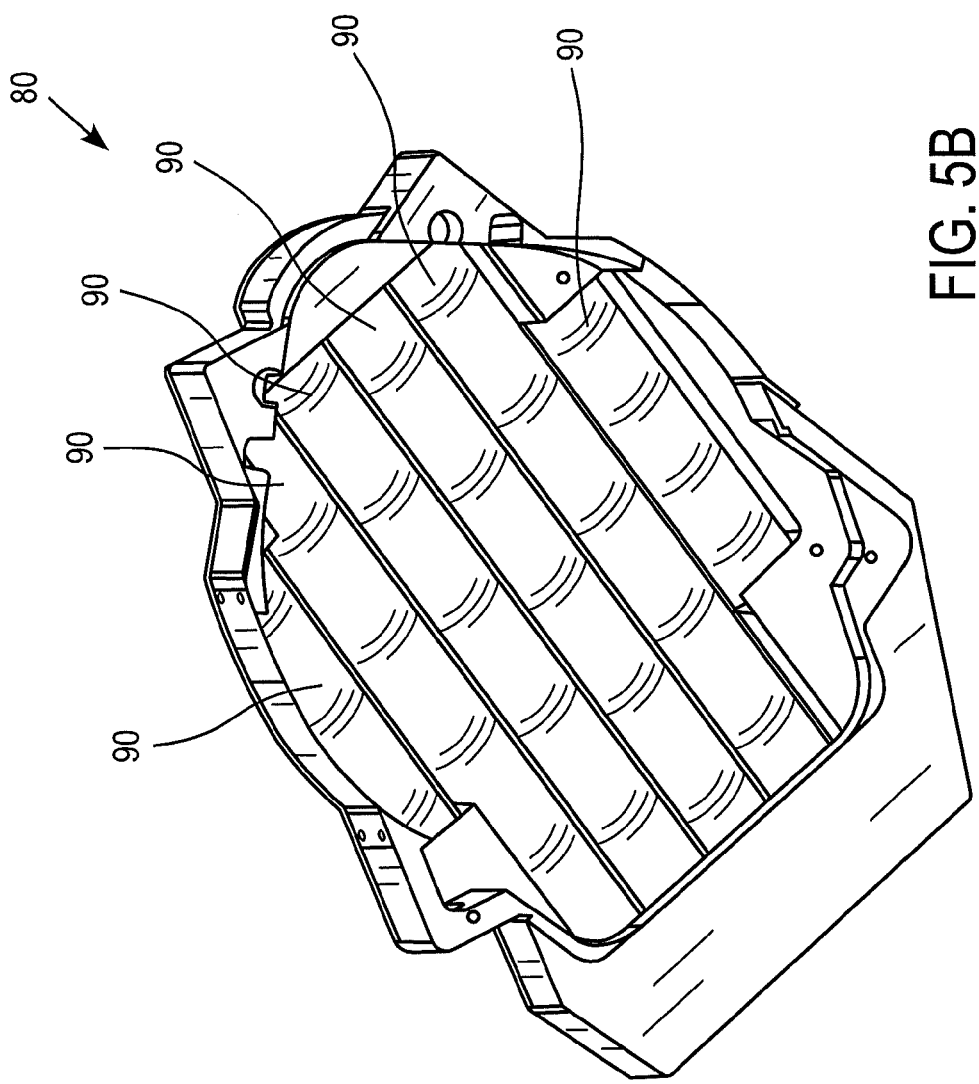
FIG. 5b shows a perspective view of a UV lamp assembly wherein the rotary shutters are in the closed position.

FIG. 5*b* shows a perspective view of the UV lamp assembly 80 of FIG. 5*a* wherein the rotary shutters 90 are in the closed position.

Figure 6:
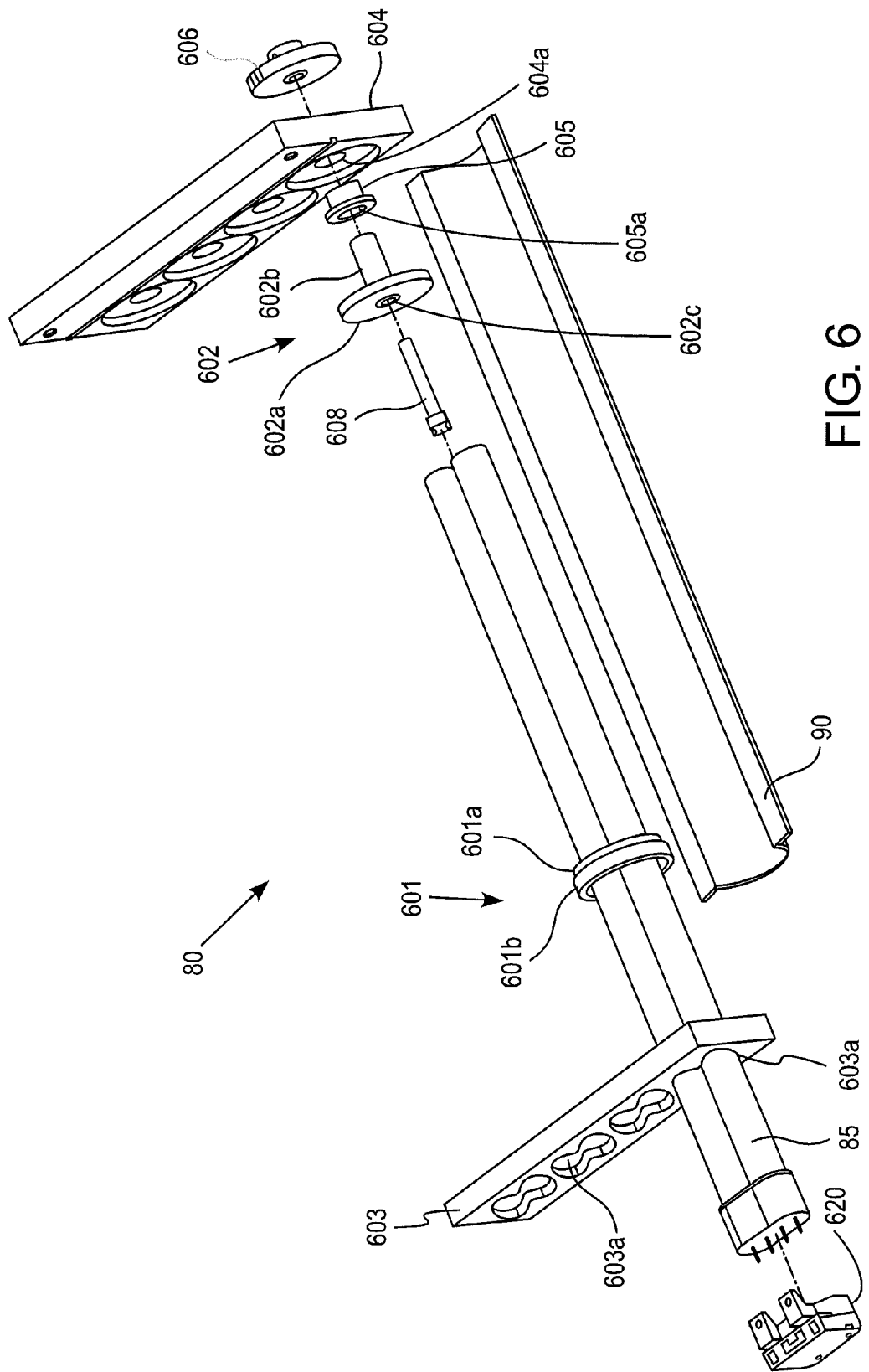
FIG. 6 shows a partial exploded view of a UV lamp assembly according to one embodiment.

FIG. 6 shows a UV lamp assembly 80 according to one embodiment. One end of a rotary shutter 90 is attached (adhered, fastened, soldered, or the like) to a smaller outer diameter surface 601*a* of a rotatable annular shutter support 601 and an opposite end of the shutter 90 is attached to an outer periphery 602*a* of a stemmed shutter support 602. A larger diameter outer surface 601*b* of the shutter support 601 is rotatably mounted in a cylindrical recess (not shown) in an inner surface of a bearing block 603 which includes a plurality of laterally spaced apart mounting holes 603*a* to fixedly support a series of parallel UV lamps 85. A flanged bearing 605 having a center hole 605*a* is mounted in one of a plurality of laterally spaced apart holes 604*a* in a bearing block 604 arranged parallel to and spaced from the bearing block 603. A stem 602*b* of the stemmed shutter support 602 is rotatably supported in the center hole 605*a* of the flanged bearing 605. The UV lamp 85 is disposed through a mounting hole 603*a* in the bearing block 603 and passes through the center of the shutter support 601. An opposite end of the lamp 85 is supported by one axial end of a support pin 608. The support pin 608 has a stem rotatably supported in a center hole 602*c* of the stemmed shutter support 602. With this mounting arrangement, each UV lamp 85 remains stationary while the rotary shutter 90 rotates between the open and closed positions. An electrical socket 620 is connected to the UV lamp 85 to provide electrical power thereto. The stem 602*b* is attached to a drive pulley 606 located on an outer surface of the bearing block 604 and an outer surface of the drive pulley 606 engages a drive belt (not shown). The drive belt is moved back and forth by a suitable drive mechanism such that the drive pulley 606 effects rotation of the stemmed shutter support 602 by movement of the drive belt to rotate the shutter to the open and closed positions. The bearing block 603 and the flanged bearing 605 can be made of a heat resistant polymer material such as Torlon®. The bearing block 604 and the shutter support 602 can be made of a metallic material such as aluminum.

Figure 7:
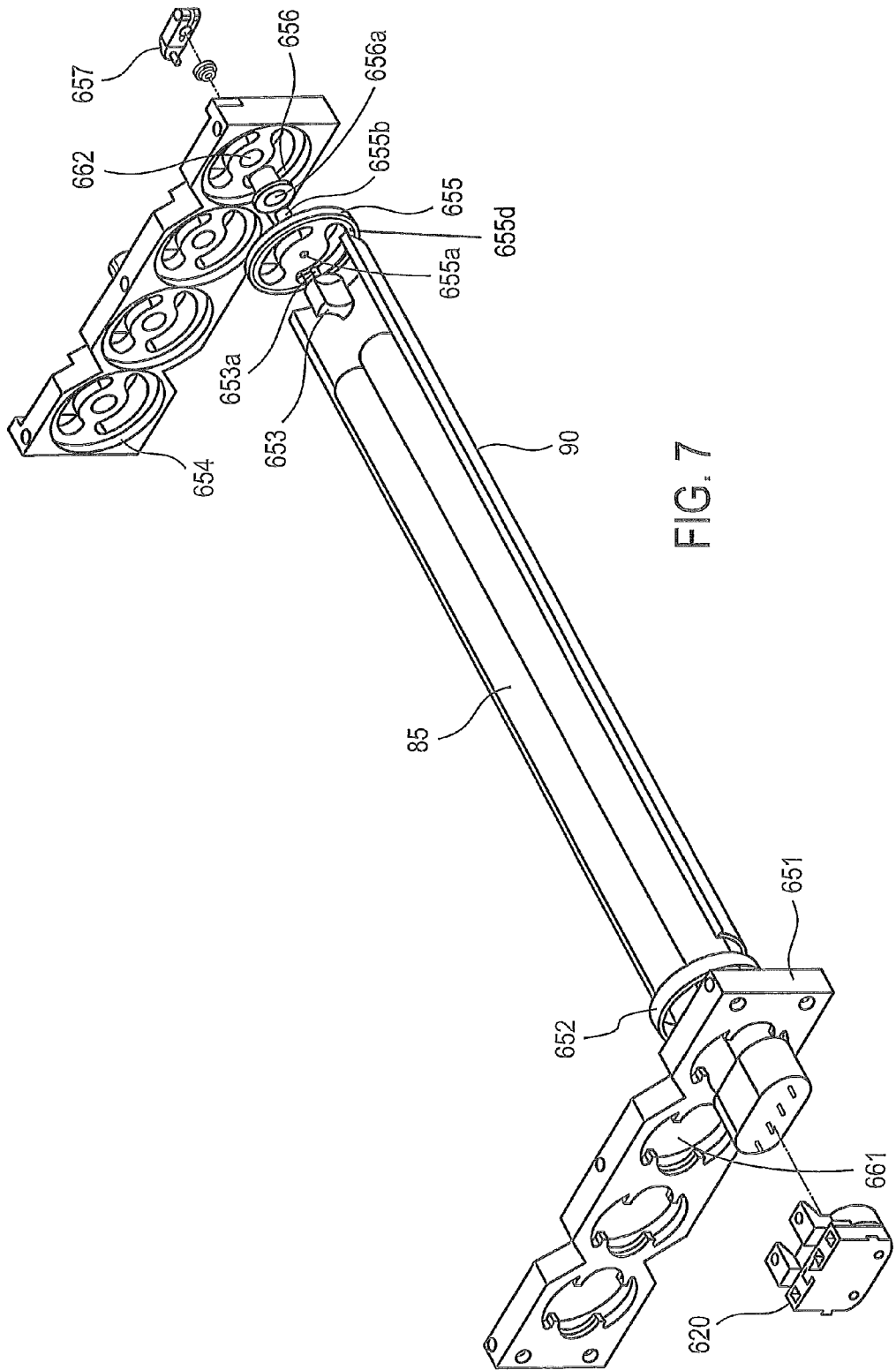
FIG. 7 shows a partial exploded view of a UV lamp assembly according to another embodiment.
Figure 8:
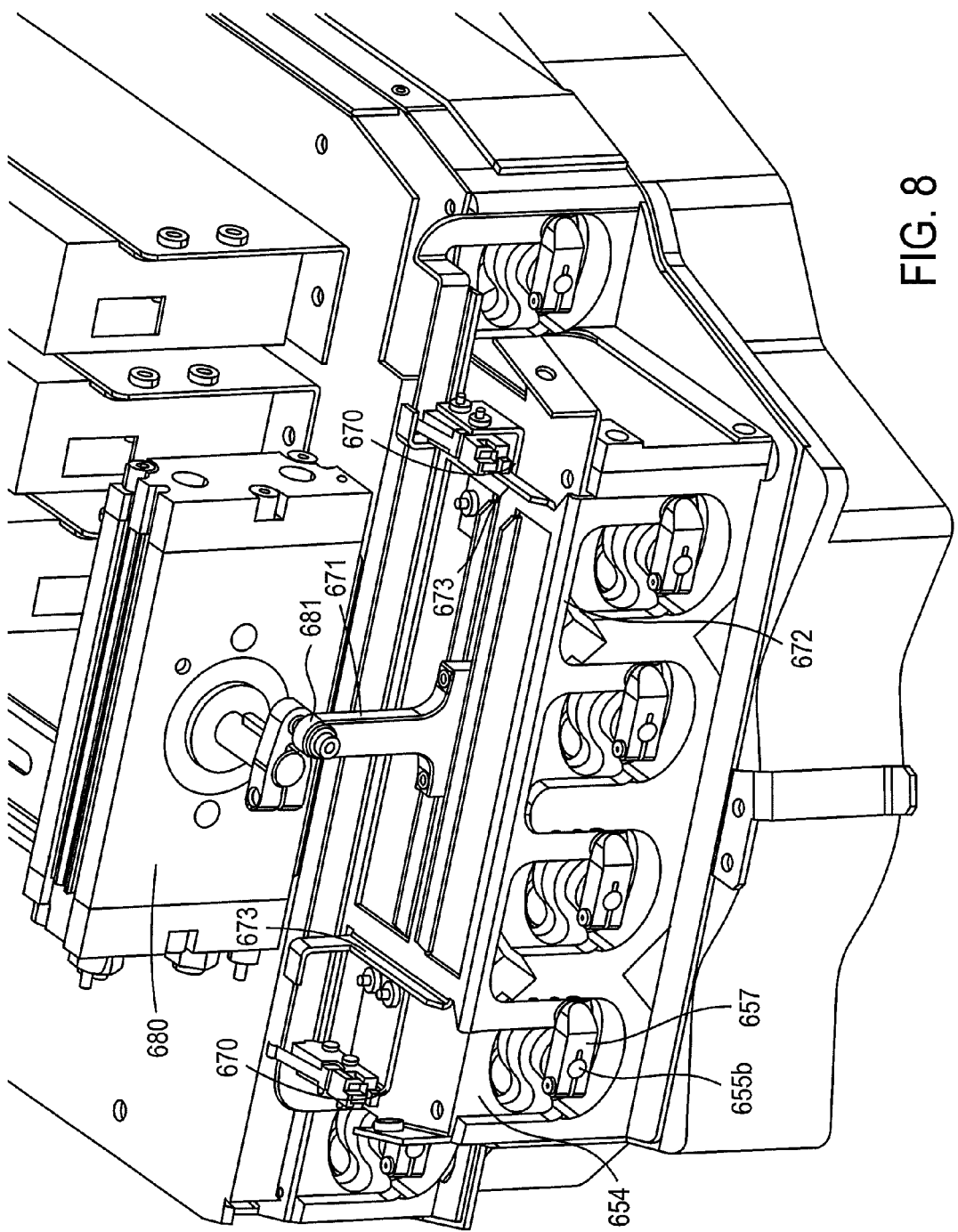
FIG. 8 shows a perspective view of the UV lamp assembly of FIG. 7, wherein rotary shutters are in a closed position.
Figure 9:
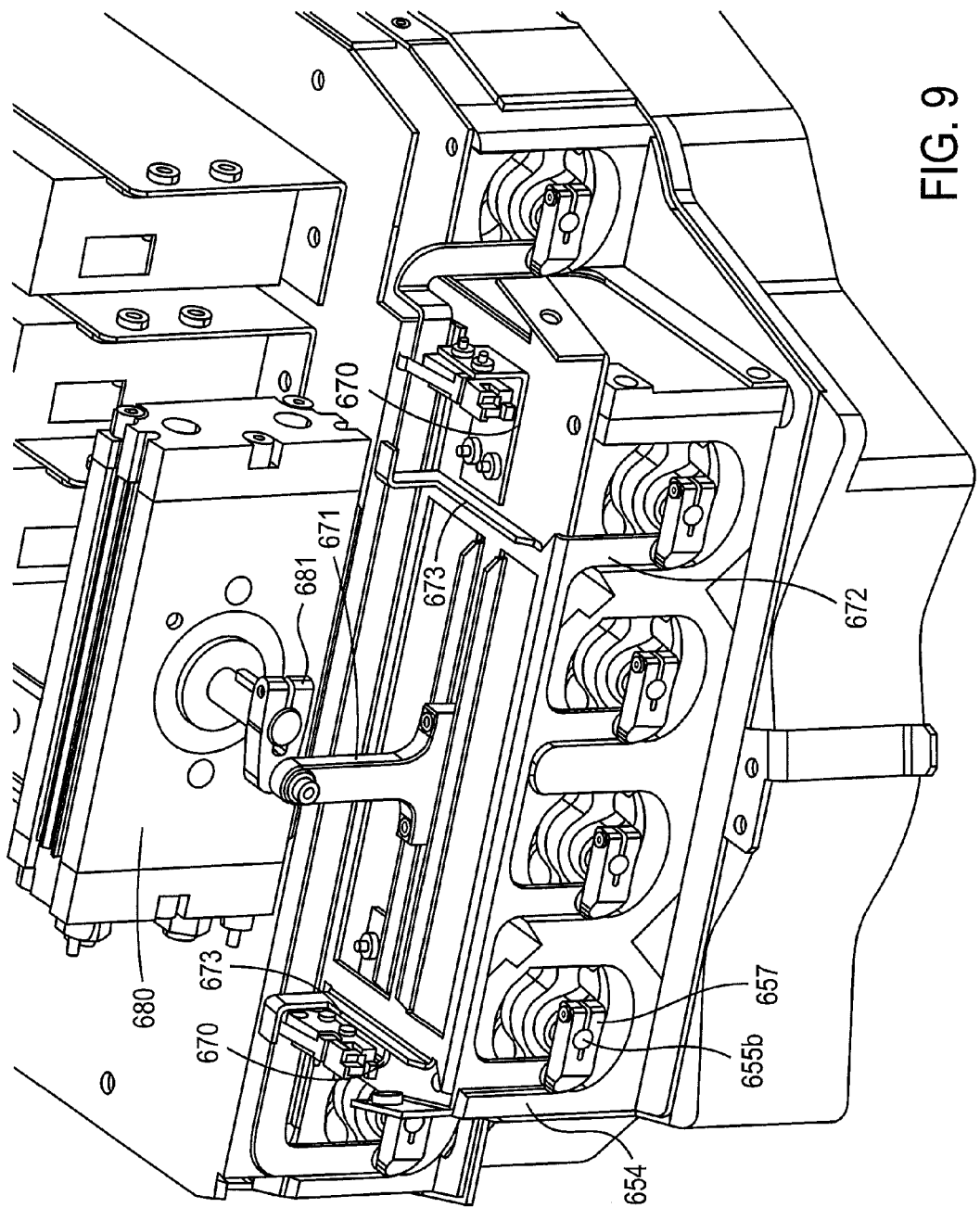
FIG. 9 shows a perspective view of the UV lamp assembly of FIG. 7, wherein rotary shutters are in an open position.

In another embodiment as shown in FIGS. 7-9, one end of each UV lamp 85 has electrical connections for receiving electricity from a socket 620. This end is supported through one of a plurality of laterally spaced apart holes 661 in a socket plate 651 made of Torlon®. The other end of the UV lamp 85 is supported by a stemmed support pin 653 made of Teflon®. For a dual-tubular shaped UV lamp, the pin 653 includes a fitting which has curved surfaces mating with outer surfaces of the dual-tubular shaped UV lamp. The rotary shutter 90 surrounding the UV lamp 85 is attached to an annular bearing 652 made of Torlon® and a drive spindle 655 having a stem 655*b*, a center hole 655*a*, and a groove 655*d*. The annular bearing 652 can also include a groove (not shown) wherein a first end edge of the rotary shutter 90 can be supported in the groove of the annular bearing 652 and a second end edge of the rotary shutter 90 can be supported in the groove 655*d* of the drive spindle 655. The UV lamp 85 passes through a center hole of the bearing 652 and the bearing 652 is rotatably mounted in a cylindrical recess in an inner surface of the socket plate 651. A flanged bearing 656 having a center hole 656*a* is mounted in one of a plurality of laterally spaced apart holes 662 in a support plate 654 arranged parallel to the socket plate 651. The stem 655*b* of the drive spindle 655 extends through and is rotatably mounted in the center hole 656*a* of the flanged bearing 656. A stem 653*a* of the stemmed support pin 653 is rotatably supported in the center hole 655*a* of the drive spindle 655.

Referring to FIGS. 8-9, a cantilevered drive arm 657 is fixedly attached to the stem 655*b* of each of the drive spindles 655 outwardly of an outer surface of the support plate 654. Ends of the drive arms 657 are rotatably attached to vertical arms of a horizontally extending arm linkage 672 which moves laterally back and forth to simultaneously rotate the drive arms 657 clockwise and counterclockwise to open and close the rotary shutters. The arm linkage 672 has a vertical actuator arm 671 rotatably attached to an end of a revolving arm 681 of a rotary actuator 680 which rotates the revolving arm 681 between laterally offset positions. The rotary actuator 680 is operable to drive the arm linkage 672 such that ends 673 of the arm linkage 672 engage two stops (shown in FIGS. 8-9 respectively). At each stop, an end 673 of the arm linkage 672 triggers a position switch 670 which signals the rotary actuator 680 to stop rotation and prevent over-driving the arm linkage 672.

While the UV lamp assembly and the rotary shutters have been described in detail with reference to specific embodiments thereof, it will be apparent to those skilled in the art that various changes and modifications can be made, and equivalents employed, without departing from the scope of the appended claims. For example, UV lamps can be replaced by other types of lamps.

We claim:

1. A UV lamp assembly for a degas chamber comprising a plurality of parallel UV lamps and rotary shutters, each rotary shutter comprising a concave wall surrounding a UV lamp and two flanges extending outwardly and bend away from longitudinal edges of the concave wall, the rotary shutters configured to rotate between an open position and a closed position, wherein the rotary shutters at the open position are arranged above the UV lamps so as to reflect UV light of the UV lamps into the degas chamber without blocking UV light of the UV lamps from passing into the degas chamber; and the rotary shutters at the closed position, at which the flanges of adjacent rotary shutters overlap to prevent UV light leakage, are arranged below the UV lamps so as to block UV light of the UV lamps from passing into the degas chamber.

2. The UV lamp assembly of claim 1 wherein a concave surface of the concave wall is a reflective surface.

3. The UV lamp assembly of claim 1 wherein the concave wall is semi-cylindrical and each end of the concave wall is in a groove of a support member, the UV lamp assembly further comprising a drive mechanism operable to rotate the shutters between the open and closed positions.

4. The UV lamp assembly of claim 1 wherein the flanges of each rotary shutter are co-planar; have a width of about 0.07 to 0.09 inch; and longitudinal ends of the flanges are spaced at least about 0.1 inch from longitudinal ends of the concave wall.

5. The UV lamp assembly of claim 1 wherein the flanges of each rotary shutter overlap the flanges of an adjacent rotary shutter by about 0.03 to 0.05 inch at the closed position.

6. The UV lamp assembly of claim 1 further comprising:
a support block having a hole for each rotary shutter;
a spindle having a stem for each rotary shutter;
a drive mechanism; and
wherein:
the rotary shutter is attached to the spindle;
the stem of the spindle is rotatably supported in the hole of the support block; and
the stem of the spindle is driven by the drive mechanism such that the attached rotary shutter is rotatable between the open and closed positions.

7. The UV lamp assembly of claim 1, wherein each UV lamp comprises a pair of parallel cylindrical tubes bonded together.

8. The UV lamp assembly of claim 1, comprising four UV lamps having a first length and two UV lamps having a second length at least 10% shorter than the first length, the four longer length lamps located between the two shorter length lamps, the rotary shutters on the six lamps being operated simultaneously.

9. A degas chamber comprising the UV lamp assembly of claim 1 wherein ozone or oxygen gas removes halogen-containing residues from a semiconductor substrate supported in the degas chamber.

10. A degas chamber of claim 9 wherein interior surfaces of the degas chamber exposed to UV light of the UV lamp assembly are blackened to reduce reflection of UV light and the UV light decomposes the ozone gas or oxygen into oxygen radicals which react with the halogen-containing residues on the semiconductor substrate and gaseous reaction products are evacuated from the degas chamber by a vacuum pump.

11. A method of processing a semiconductor substrate using the degas chamber of claim 9, comprising:
rotating the rotary shutters to the closed position;
transporting a semiconductor substrate into the degas chamber;
rotating the rotary shutters to the open position;
supplying ozone gas or $O_2$ gas into the degas chamber while maintaining a vacuum pressure in the chamber of 10 mTorr to 10 Torr;
generating O radicals by irradiating the ozone gas or $O_2$ gas in the degas chamber through a quartz window with UV light;
removing halogen-containing residues on the semiconductor substrate by reaction with the O radicals;
rotating the rotary shutters to the closed position;
removing the semiconductor substrate from the degas chamber.

12. The UV lamp assembly of claim 1, wherein one end of each rotary shutter is attached to an annular shutter support and an opposite end is attached to a stemmed shutter support, the annular shutter support and stemmed shutter support rotatably mounted in cylindrical recesses of opposed bearing blocks, and a drive mechanism connected to each stemmed shutter support moves the rotary shutters between the open and closed positions.

13. The UV lamp assembly of claim 1, wherein an end of each rotary shutter is attached to an annular bearing and a drive spindle having a stem and center hole, a UV lamp of the lamp assembly passing through a center hole of the bearing and the bearing rotatably mounted in a cylindrical recess in an inner surface of a socket plate.

14. The UV lamp assembly of claim 1, wherein cantilevered drive arms are fixedly attached to stems of drive spindles attached to the rotary shutters and ends of the drive arms are rotatably attached to linkage which moves laterally back and forth to open and close the rotary shutters.

* * * * *